United States Patent
Song et al.

(10) Patent No.: US 11,251,249 B2
(45) Date of Patent: Feb. 15, 2022

(54) DISPLAY PANEL, DISPLAY APPARATUS, DISPLAY SUBSTRATE, AND METHOD OF FABRICATING DISPLAY PANEL AND DISPLAY APPARATUS

(71) Applicant: BOE Technology Group Co., Ltd., Beijing (CN)

(72) Inventors: Zhen Song, Beijing (CN); Guoying Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 427 days.

(21) Appl. No.: 16/464,207

(22) PCT Filed: May 31, 2018

(86) PCT No.: PCT/CN2018/089236
§ 371 (c)(1),
(2) Date: May 24, 2019

(87) PCT Pub. No.: WO2019/227385
PCT Pub. Date: Dec. 5, 2019

(65) Prior Publication Data
US 2021/0118970 A1    Apr. 22, 2021

(51) Int. Cl.
*H01L 27/32*    (2006.01)
*H05B 45/00*    (2022.01)
(Continued)

(52) U.S. Cl.
CPC .......... *H01L 27/3269* (2013.01); *H01L 25/18* (2013.01); *H01L 27/322* (2013.01);
(Continued)

(58) Field of Classification Search
CPC combination set(s) only.
See application file for complete search history.

(56) References Cited

U.S. PATENT DOCUMENTS

| | | |
|---|---|---|
| 2007/0035489 A1 | 2/2007 | Lee |
| 2007/0177072 A1 | 8/2007 | Chang |
| | (Continued) | |

FOREIGN PATENT DOCUMENTS

| | | |
|---|---|---|
| CN | 101008747 A | 8/2007 |
| CN | 101135795 A | 3/2008 |
| | (Continued) | |

OTHER PUBLICATIONS

CN1063978679A machine English translation (Year: 2017).*
(Continued)

*Primary Examiner* — Anne M Hines
(74) *Attorney, Agent, or Firm* — Intellectual Valley Law, P.C.

(57) ABSTRACT

The present application provides a display panel having a plurality of subpixels. The display panel includes an array substrate including an array of a plurality of first thin film transistors respectively in the plurality of subpixels for driving light emission of the display panel; a counter substrate facing the array substrate and having a plurality of subpixel areas respectively in the plurality of subpixels; and an optical compensation device for adjusting in real time actual light emitting brightness values of the plurality of subpixel areas to target brightness values. The optical compensation device includes a plurality of actual light emitting brightness value detectors integrated in the counter substrate and respectively in the plurality of subpixel areas.

18 Claims, 12 Drawing Sheets

(51) Int. Cl.
*H05B 45/10* (2020.01)
*H01L 25/18* (2006.01)
*H01L 51/56* (2006.01)

(52) U.S. Cl.
CPC .............. *H01L 51/56* (2013.01); *H05B 45/10* (2020.01); *H05B 45/60* (2020.01); *H01L 2227/323* (2013.01)

(56) References Cited

U.S. PATENT DOCUMENTS

| | | |
|---|---|---|
| 2010/0128010 A1 | 5/2010 | Katoh et al. |
| 2010/0149146 A1 | 6/2010 | Yamashita et al. |
| 2011/0175871 A1 | 7/2011 | Katoh et al. |
| 2018/0033398 A1 | 2/2018 | Okamoto |
| 2018/0350310 A1 | 12/2018 | Xiao et al. |
| 2019/0129239 A1 | 5/2019 | Li et al. |

FOREIGN PATENT DOCUMENTS

| | | | | |
|---|---|---|---|---|
| CN | 101576666 A | | 11/2009 | |
| CN | 101675375 A | | 3/2010 | |
| CN | 101751857 A | | 6/2010 | |
| CN | 101779299 A | | 7/2010 | |
| CN | 102645274 A | | 8/2012 | |
| CN | 106297679 A | * | 1/2017 | ........... G09G 3/3225 |
| CN | 106297679 A | | 1/2017 | |
| CN | 106873832 A | | 6/2017 | |
| CN | 107632451 A | | 1/2018 | |
| JP | 2008191611 A | | 8/2008 | |
| KR | 100762677 B1 | | 10/2007 | |

OTHER PUBLICATIONS

First Office Action in the Chinese Patent Application No. 201880000484.6, dated Nov. 4, 2020; English translation attached.
International Search Report & Written Opinion dated Apr. 3, 2019, regarding PCT/CN2018/089236.

* cited by examiner

DISPLAY PANEL, DISPLAY APPARATUS, DISPLAY SUBSTRATE, AND METHOD OF FABRICATING DISPLAY PANEL AND DISPLAY APPARATUS

CROSS-REFERENCE TO RELATED APPLICATION

This application is a national stage application under 35 U.S.C. § 371 of International Application No. PCT/CN2018/089236, filed May 31, 2018, the contents of which are incorporated by reference in the entirety.

TECHNICAL FIELD

The present invention relates to display technology, more particularly, to a display panel, a display apparatus, a display substrate, a method of fabricating a display panel, and a method of fabricating a display apparatus.

BACKGROUND

Organic light emitting diode (OLED) display apparatuses are self-emissive devices, and do not require backlights. OLED display apparatuses also provide more vivid colors and a larger color gamut as compared to the conventional liquid crystal display (LCD) apparatuses. Further, OLED display apparatuses can be made more flexible, thinner, and lighter than a typical LCD apparatus.

SUMMARY

In one aspect, the present invention provides a display panel having a plurality of subpixels, comprising an army substrate comprising an array of a plurality of first thin film transistors respectively in the plurality of subpixels for driving light emission of the display panel; a counter substrate facing the array substrate and having a plurality of subpixel areas respectively in the plurality of subpixels; and an optical compensation device for adjusting in real time actual light emitting brightness values of the plurality of subpixel areas to target brightness values; wherein the optical compensation device comprises a plurality of actual light emitting brightness value detectors integrated in the counter substrate and respectively in the plurality of subpixel areas.

Optionally, the counter substrate comprises a base substrate; a plurality of second thin film transistors on the base substrate and respectively in the plurality of subpixel areas; and a plurality of photosensors respectively connected to the plurality of second thin film transistors and respectively in the plurality of subpixel areas, the plurality of photosensors being configured to detect actual light emitting brightness values of the plurality of subpixel areas respectively; wherein each of the plurality of actual light emitting brightness value detectors comprises one of the plurality of second thin film transistors and one of the plurality of photosensors electrically connected to each other.

Optionally, the display panel further comprises a plurality of read lines for respectively transmitting signals detected by the plurality of actual light emitting brightness value detectors; and a compensation circuit connected to the plurality of read lines, and configured to adjust in real time the actual light emitting brightness values of the plurality of subpixel areas to the target brightness values.

Optionally, the display panel further comprises a common electrode configured to be provided with a common voltage signal; wherein each of the plurality of photosensors comprises a first polarity region connected to the common electrode, a second polarity region connected to a source electrode of one of the plurality of second thin film transistors, and a diode junction connecting the first polarity region and the second polarity region; and each of the plurality of second thin film transistors comprises a gate electrode, a source electrode connected to a second polarity region of one of the plurality of photosensors, and a drain electrode connected to one of the plurality of read lines.

Optionally, the common electrode is an integral electrode block extending throughout the counter substrate; and the integral electrode block is electrically connected to first polarity regions of the plurality of photosensors; wherein the display panel further comprises a common voltage signal line connected to the integral electrode block and configured to provide the common voltage signal to the integral electrode block.

Optionally, the display panel further comprises a black matrix; wherein the black matrix comprises a plurality of black matrix rows and a plurality of black matrix columns intersecting each other, the plurality of black matrix rows substantially along a first direction, the plurality of black matrix columns substantially along a second direction; and an orthographic projection of the integral electrode block on the base substrate at least partially overlaps with an orthographic projection of each of the plurality of black matrix rows on the base substrate, and at least partially overlaps with an orthographic projection of each of the plurality of black matrix columns on the base substrate.

Optionally, the common electrode comprises a plurality of common electrode blocks; and each of the plurality of common electrode blocks is electrically connected to the first polarity region of one of the plurality of photosensors; wherein the display panel further comprises a plurality of common voltage signal lines respectively connected to the plurality of common electrode blocks, and configured to provide the common voltage signal to the plurality of common electrode blocks.

Optionally, the plurality of common voltage signal lines and the plurality of read lines are substantially along a same direction.

Optionally, the counter substrate further comprises a plurality of color filter blocks; the plurality of photosensors are respectively between the plurality of color filter blocks and the base substrate; and an orthographic projection of each individual one of the plurality of photosensors on the base substrate at least partially overlaps with an orthographic projection of a respective one of the plurality of color filter blocks on the base substrate.

Optionally, the display panel further comprises a common electrode configured to be provided with a common voltage signal; wherein an orthographic projection of the common electrode on the base substrate partially overlaps with an orthographic projection of one of the plurality of photosensors on the base substrate; and a portion of the common electrode is between one of the plurality of color filter blocks and one of the plurality of photosensors in a same one of the plurality of subpixel areas.

Optionally, the plurality of second thin film transistors are a plurality of bottom gate, back channel etch-type thin film transistors; each of the plurality of second thin film transistors further comprises an active layer, a barrier layer, and a gate insulating layer; the active layer is on a side of the gate electrode distal to the base substrate; the barrier layer is on a side of the active layer distal to the gate electrode, the barrier layer formed by a back channel etch process; and the source electrode and the drain electrode are on a side of the active layer distal to the base substrate.

Optionally, the common electrode is a substantially transparent electrode.

Optionally, the counter substrate further comprises an overcoat layer on a side of the plurality of second thin film transistors and the plurality of photosensors distal to the base substrate; and a spacer layer on a side of the overcoat layer distal to the base substrate.

Optionally, the display panel further comprises an auxiliary cathode on a side of the space layer distal to the base substrate.

Optionally, each of the plurality of photosensors is a PN photodiode, the first polarity region is a P+ doping semiconductor region, and the second polarity region is an N+ doping semiconductor region.

Optionally, each of the plurality of photosensors is a PIN photodiode, the first polarity region is a P+ doping semiconductor region, and the second polarity region is an N+ doping semiconductor region, the PIN photodiode further comprises an intrinsic region of amorphous silicon between the P+ doping semiconductor region and the N+ doping semiconductor region.

Optionally, the display panel is an organic light emitting diode display panel comprising a plurality of organic light emitting diodes; and the plurality of actual light emitting brightness value detectors are configured to detect actual light emitting brightness values of the plurality of organic light emitting diodes respectively.

In another aspect, the present invention provides a display apparatus, comprising the display panel described herein, and a compensation circuit configured to receive in real time the actual light emitting brightness values of the plurality of subpixel areas, and configured to adjust in real time the actual light emitting brightness values of the plurality of subpixel areas to the target brightness values.

In another aspect, the present invention provides a display substrate having a plurality of subpixel areas, comprising a plurality of actual light emitting brightness value detectors integrated in the display substrate and respectively in the plurality of subpixel areas.

Optionally, the display substrate further comprises a base substrate; a plurality of second thin film transistors on the base substrate and respectively in the plurality of subpixel areas; and a plurality of photosensors respectively connected to the plurality of second thin film transistors and respectively in the plurality of subpixel areas, the plurality of photosensors configured to detect actual light emitting brightness values of the plurality of subpixel areas respectively; wherein each of the plurality of actual light emitting brightness value detectors comprises one of the plurality of second thin film transistors and one of the plurality of photosensors electrically connected to each other.

Optionally, the display substrate further comprises a plurality of read lines for respectively transmitting signals detected by the plurality of actual light emitting brightness value detectors.

Optionally, the display substrate further comprises a common electrode configured to be provided with a common voltage signal, wherein each of the plurality of photosensors comprises a first polarity region connected to the common electrode, a second polarity region connected to a source electrode of one of the plurality of second thin film transistors, and a diode junction connecting the first polarity region and the second polarity region; and each of the plurality of second thin film transistors comprises a gate electrode, a source electrode connected to a second polarity region of one of the plurality of photosensors, and a drain electrode connected to one of the plurality of read lines.

Optionally, the common electrode is an integral electrode block extending throughout the display substrate; and the integral electrode block is electrically connected to first polarity regions of the plurality of photosensors; wherein the display substrate further comprises a common voltage signal line connected to the integral electrode block and configured to provide the common voltage signal to the integral electrode block.

Optionally, the display substrate further comprises a black matrix; wherein the black matrix comprises a plurality of black matrix rows and a plurality of black matrix columns intersecting each other, the plurality of black matrix rows substantially along a first direction, the plurality of black matrix columns substantially along a second direction; and an orthographic projection of the integral electrode block on the base substrate at least partially overlaps with an orthographic projection of each of the plurality of black matrix rows on the base substrate, and at least partially overlaps with an orthographic projection of each of the plurality of black matrix columns on the base substrate.

Optionally, the common electrode comprises a plurality of common electrode blocks; and each of the plurality of common electrode blocks is electrically connected to the first polarity region of one of the plurality of photosensors; wherein the display substrate further comprises a plurality of common voltage signal lines respectively connected to the plurality of common electrode blocks, and configured to provide the common voltage signal to the plurality of common electrode blocks.

Optionally, the plurality of common voltage signal lines and the plurality of read lines are substantially along a same direction.

Optionally, the display substrate further comprises a plurality of color filter blocks; the plurality of photosensors are respectively between the plurality of color filter blocks and the base substrate; and an orthographic projection of each individual one of the plurality of photosensors on the base substrate at least partially overlaps with an orthographic projection of a respective one of the plurality of color filter blocks on the base substrate.

Optionally, the display substrate further comprises a common electrode configured to be provided with a common voltage signal; wherein an orthographic projection of the common electrode on the base substrate partially overlaps with an orthographic projection of one of the plurality of photosensors on the base substrate; and a portion of the common electrode is between one of the plurality of color filter blocks and one of the plurality of photosensors in a same one of the plurality of subpixel areas.

Optionally, the plurality of second thin film transistors are a plurality of bottom gate, back channel etch-type thin film transistors; each of the plurality of second thin film transistors further comprises an active layer, a barrier layer, and a gate insulating layer; the active layer is on a side of the gate electrode distal to the base substrate; the barrier layer is on a side of the active layer distal to the gate electrode, the barrier layer formed by a back channel etch process; and the source electrode and the drain electrode are on a side of the active layer distal to the base substrate.

Optionally, the common electrode is a substantially transparent electrode.

Optionally, the display substrate further comprises an overcoat layer on a side of the plurality of second thin film transistors and the plurality of photosensors distal to the base substrate; and a spacer layer on a side of the overcoat layer distal to the base substrate.

Optionally, the display substrate further comprises an auxiliary cathode on a side of the space layer distal to the base substrate.

Optionally, each of the plurality of photosensors is a PN photodiode, the first polarity region is a P+ doping semiconductor region, and the second polarity region is an N+ doping semiconductor region.

Optionally, each of the plurality of photosensors is a PIN photodiode, the first polarity region is a P+ doping semiconductor region, and the second polarity region is an N+ doping semiconductor region, the PIN photodiode further comprises an intrinsic region of amorphous silicon between the P+ doping semiconductor region and the N+ doping semiconductor region.

Optionally, the display substrate is a counter substrate.

In another aspect, the present invention provides a method of fabricating a display panel having a plurality of subpixels, comprising forming an array substrate comprising an array of a plurality of first thin film transistors respectively in the plurality of subpixels for driving light emission of the display panel; forming a counter substrate facing the array substrate and having a plurality of subpixel areas respectively in the plurality of subpixels; and forming an optical compensation device for adjusting in real time actual light emitting brightness values of the plurality of subpixel areas to target brightness values; wherein forming the optical compensation device comprises forming a plurality of actual light emitting brightness value detectors integrated in the counter substrate and respectively in the plurality of subpixel areas.

Optionally, forming the counter substrate comprises forming a plurality of second thin film transistors on a base substrate and respectively in the plurality of subpixel areas; and forming a plurality of photosensors respectively connected to the plurality of second thin film transistors and respectively in the plurality of subpixel areas, the plurality of photosensors configured to detect actual light emitting brightness values of the plurality of subpixel areas respectively; wherein each of the plurality of actual light emitting brightness value detectors is formed to comprise one of the plurality of second thin film transistors and one of the plurality of photosensors electrically connected to each other.

Optionally, the method further comprises forming a plurality of read lines for respectively transmitting signals detected by the plurality of actual light emitting brightness value detectors; and forming a compensation circuit connected to the plurality of read lines, and configured to adjust in real time the actual light emitting brightness values of the plurality of subpixel areas to the target brightness values.

Optionally, the method further comprises forming a common electrode configured to be provided with a common voltage signal; wherein each of the plurality of photosensors is formed to comprise a first polarity region connected to the common electrode, a second polarity region connected to a source electrode of one of the plurality of second thin film transistors, and a diode junction connecting the first polarity region and the second polarity region; and each of the plurality of second thin film transistors is formed to comprise a gate electrode, a source electrode connected to a second polarity region of one of the plurality of photosensors, and a drain electrode connected to one of the plurality of read lines.

Optionally, forming the common electrode comprises forming an integral electrode block extending throughout the counter substrate; and the integral electrode block is formed to be electrically connected to first polarity regions of the plurality of photosensors; wherein the method further comprises forming a common voltage signal line connected to the integral electrode block and configured to provide the common voltage signal to the integral electrode block.

Optionally, the method further comprises forming a black matrix; wherein the black matrix is formed to comprise a plurality of black matrix rows and a plurality of black matrix columns intersecting each other, the plurality of black matrix rows substantially along a first direction, the plurality of black matrix columns substantially along a second direction; and the common electrode and the black matrix are formed so that an orthographic projection of the integral electrode block on the base substrate at least partially overlaps with an orthographic projection of each of the plurality of black matrix rows on the base substrate, and at least partially overlaps with an orthographic projection of each of the plurality of black matrix columns on the base substrate.

Optionally, forming the common electrode comprises forming a plurality of common electrode blocks; and each of the plurality of common electrode blocks is formed to be electrically connected to the first polarity region of one of the plurality of photosensors; wherein the method further comprises forming a plurality of common voltage signal lines respectively connected to the plurality of common electrode blocks, and configured to provide the common voltage signal to the plurality of common electrode blocks.

Optionally, the plurality of common voltage signal lines and the plurality of read lines are formed substantially along a same direction.

Optionally, forming the counter substrate further comprises forming a plurality of color filter blocks; the plurality of photosensors are formed respectively between the plurality of color filter blocks and the base substrate; and the plurality of photosensors and the plurality of color filter blocks are formed so that an orthographic projection of each individual one of the plurality of photosensors on the base substrate at least partially overlaps with an orthographic projection of a respective one of the plurality of color filter blocks on the base substrate.

Optionally, the method further comprises forming a common electrode configured to be provided with a common voltage signal; wherein the common electrode and the plurality of photosensors are formed so that an orthographic projection of the common electrode on the base substrate partially overlaps with an orthographic projection of one of the plurality of photosensors on the base substrate; and the common electrode, the plurality of photosensors, and the plurality of color filter blocks are formed so that a portion of the common electrode is between one of the plurality of color filter blocks and one of the plurality of photosensors in a same one of the plurality of subpixel areas.

Optionally, the plurality of second thin film transistors are formed as a plurality of bottom gate, back channel etch-type thin film transistors; each of the plurality of second thin film transistors is formed to further comprise an active layer, a barrier layer, and a gate insulating layer; the active layer is formed on a side of the gate electrode distal to the base substrate; the barrier layer is formed on a side of the active layer distal to the gate electrode, the barrier layer formed by a back channel etch process; and the source electrode and the drain electrode are formed on a side of the active layer distal to the base substrate.

Optionally, the common electrode is made of a substantially transparent electrode material.

Optionally, forming the counter substrate further comprises forming an overcoat layer on a side of the plurality of second thin film transistors and the plurality of photosensors distal to the base substrate; and forming a spacer layer on a side of the overcoat layer distal to the base substrate.

Optionally, the method further comprises forming an auxiliary cathode on a side of the space layer distal to the base substrate.

Optionally, each of the plurality of photosensors is formed as a PN photodiode, the first polarity region is a P+ doping semiconductor region, and the second polarity region is an N+ doping semiconductor region.

Optionally, each of the plurality of photosensors is formed as a PIN photodiode, the first polarity region is a P+ doping semiconductor region, and the second polarity region is an N+ doping semiconductor region, the PIN photodiode further comprises an intrinsic region of amorphous silicon between the P+ doping semiconductor region and the N+ doping semiconductor region.

Optionally, the display panel is an organic light emitting diode display panel; the method further comprises forming a plurality of organic light emitting diodes; and the plurality of actual light emitting brightness value detectors are configured to detect actual light emitting brightness values of the plurality of organic light emitting diodes respectively.

In another aspect, the present invention provides a method of fabricating a display apparatus, comprising forming a display panel according to the method described herein, and forming a compensation circuit configured to receive in real time the actual light emitting brightness values of the plurality of subpixel areas, and configured to adjust in real time the actual light emitting brightness values of the plurality of subpixel areas to the target brightness values.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In an organic light emitting diode display apparatus, light emission intensity is affected by many factors. For example, drifting of the threshold voltage, a shift of driving current, as well as a change in the mobility rate of the thin film transistors, can affect the brightness of the display. The compensation of the light emission in the organic light emitting diode display apparatus can be achieved by either an internal compensation method or an external compensation method. These compensation methods can at least partially address the issues related to the drifting of the threshold voltage, the shift of driving current, and the change in the mobility rate of the thin film transistors. However, these compensation methods cannot compensate display problems due to a decrease in light emission efficiency of the organic light emitting diode.

Accordingly, the present disclosure provides, inter alia, a display panel, a display apparatus, a display substrate, a method of fabricating a display panel, and a method of fabricating a display apparatus that substantially obviate one or more of the problems due to limitations and disadvantages of the related art. In one aspect, the present disclosure provides a display panel having a plurality of subpixels. In some embodiments, the display panel includes an array substrate having an array of a plurality of first thin film transistors respectively in the plurality of subpixels for driving light emission of the display panel; a counter substrate facing the array substrate and having a plurality of subpixel areas respectively in the plurality of subpixels; and an optical compensation device for adjusting in real time actual light emitting brightness values of the plurality of subpixel areas to target brightness values. Optionally, the optical compensation device includes a plurality of actual light emitting brightness value detectors integrated in the counter substrate and respectively in the plurality of subpixel areas.

Figure 1:
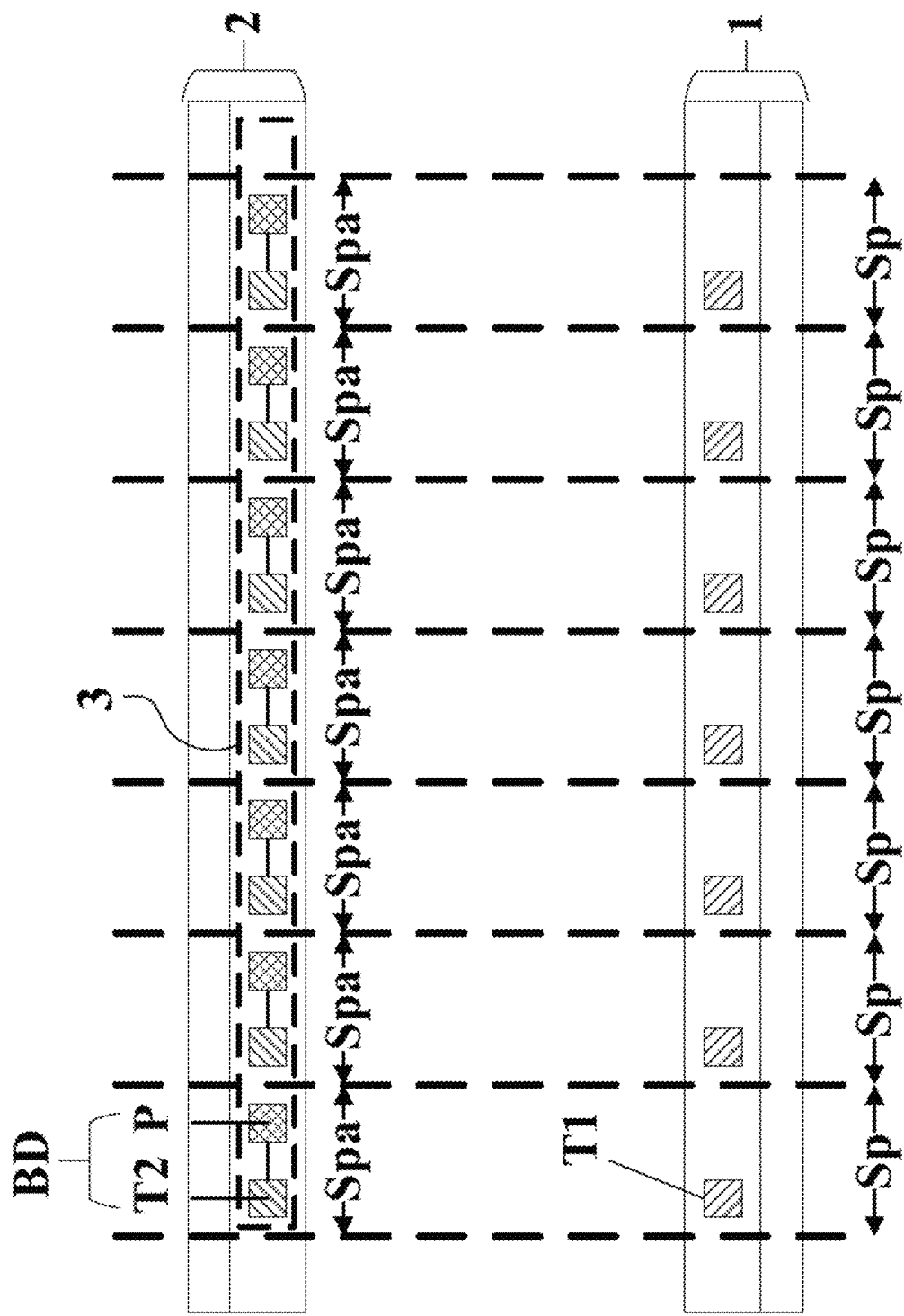
FIG. 1 is a schematic diagram illustrating the structure of a display panel in some embodiments according to the present disclosure.

FIG. 1 is a schematic diagram illustrating the structure of a display panel in some embodiments according to the present disclosure. Referring to FIG. 1, the display panel in some embodiments has a plurality of subpixels Sp. The display panel includes an array substrate 1 and a counter substrate 2 facing the array substrate 1. The counter substrate 2 has a plurality of subpixel areas Spa in the plurality of subpixels Sp of the display panel. The array substrate 1 includes an array of a plurality of first thin film transistors T1 respectively in the plurality of subpixels Sp for driving light emission of the display panel. The display panel further includes an optical compensation device 3 for adjusting in real time actual light emitting brightness values of the plurality of subpixel areas Spa to target brightness values. The optical compensation device 3 includes a plurality of actual light emitting brightness value detectors BD integrated in the counter substrate 2 and respectively in the plurality of subpixel areas Spa.

Optionally, each subpixel area of the plurality of subpixel areas Spa includes one of the plurality of actual light emitting brightness value detectors BD. Optionally, not every subpixel area includes one of the plurality of actual light emitting brightness value detectors BD, but only one out of several subpixel areas include one of the plurality of actual light emitting brightness value detectors BD in one of the plurality of subpixel areas Spa.

Figure 2:
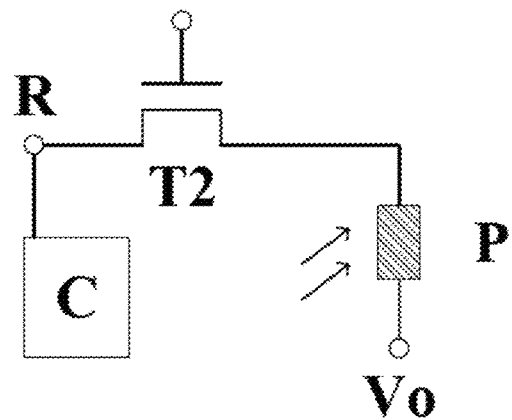
FIG. 2 is a circuit diagram of an actual light emitting brightness value detector in some embodiments according to the present disclosure.

FIG. 2 is a circuit diagram of an actual light emitting brightness value detector in some embodiments according to the present disclosure. Referring to FIG. 1 and FIG. 2, each of the plurality of actual light emitting brightness value detectors BD includes one of a plurality of second thin film transistors T2 and one of a plurality of photosensors P electrically connected to each other. The source electrode of the one of the plurality of second thin film transistors T2 is electrically connected to the one of the plurality of photosensors P. The drain electrode of the one of the plurality of second thin film transistors T2 is electrically connected to one of a plurality of read line R, which in turn is connected to a compensation circuit C.

Various appropriate photosensors having a diode junction may be utilized in making and using the present display panel. Examples of photosensors having a diode junction include, but are not limited to, a PN photodiode, a PIN photodiode, an avalanche photodiode, a MIM diode junction, a MIS diode junction, a MOS diode junction, a SIS diode junction, and a MS diode junction.

Figure 3:
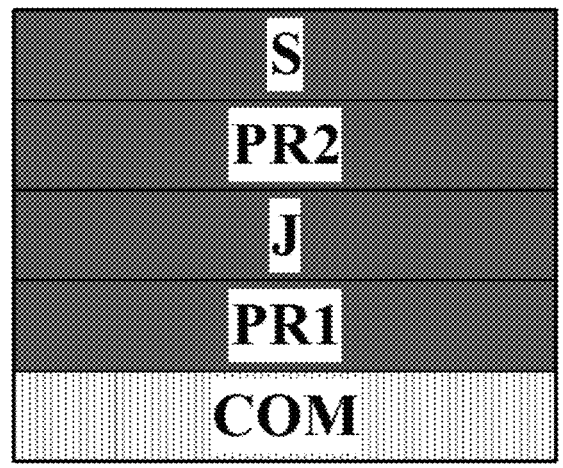
FIG. 3 is a schematic diagram illustrating the structure of a photosensor in some embodiments according to the present disclosure.

FIG. 3 is a schematic diagram illustrating the structure of a photosensor in some embodiments according to the present disclosure. Referring to FIG. 3, each of the plurality of photosensors P in some embodiments includes a first polarity region PR1 connected to a common electrode COM, a second polarity region PR2 connected to a source electrode S of one of the plurality of second thin film transistors T2, and a diode junction J connecting the first polarity region PR1 and the second polarity region PR2. As used herein, the term diode junction refers to a junction that can exhibit current rectification, e.g., a junction that exhibits drastically different conductivities in one bias direction relative to the other.

Optionally, the photosensor having a diode junction includes a first polarity region having a first dopant, a second polarity region having a second dopant, and a diode junction connecting the first polarity region and the second polarity region. Optionally, the photosensor having a diode junction is reversely biased when the first polarity region is connected to a low voltage and the second polarity region is connected to a high voltage. For example, the photosensor having a diode junction is in a reversely biased state when the first polarity region is connected to a common electrode (low voltage, e.g., −5 V to 0 V). In some embodiments, the photosensor having a diode junction is a PN junction having a P+ doping semiconductor region as the first polarity region and an N+ doping semiconductor region as the second polarity region. In some embodiments, the photosensor having a diode junction is a PIN photodiode having a P+ doping semiconductor region as the first polarity region, an N+ doping semiconductor region as the second polarity region, and an intrinsic region of amorphous silicon between the P+ doping semiconductor region and the N+ doping semiconductor region.

Figure 4:
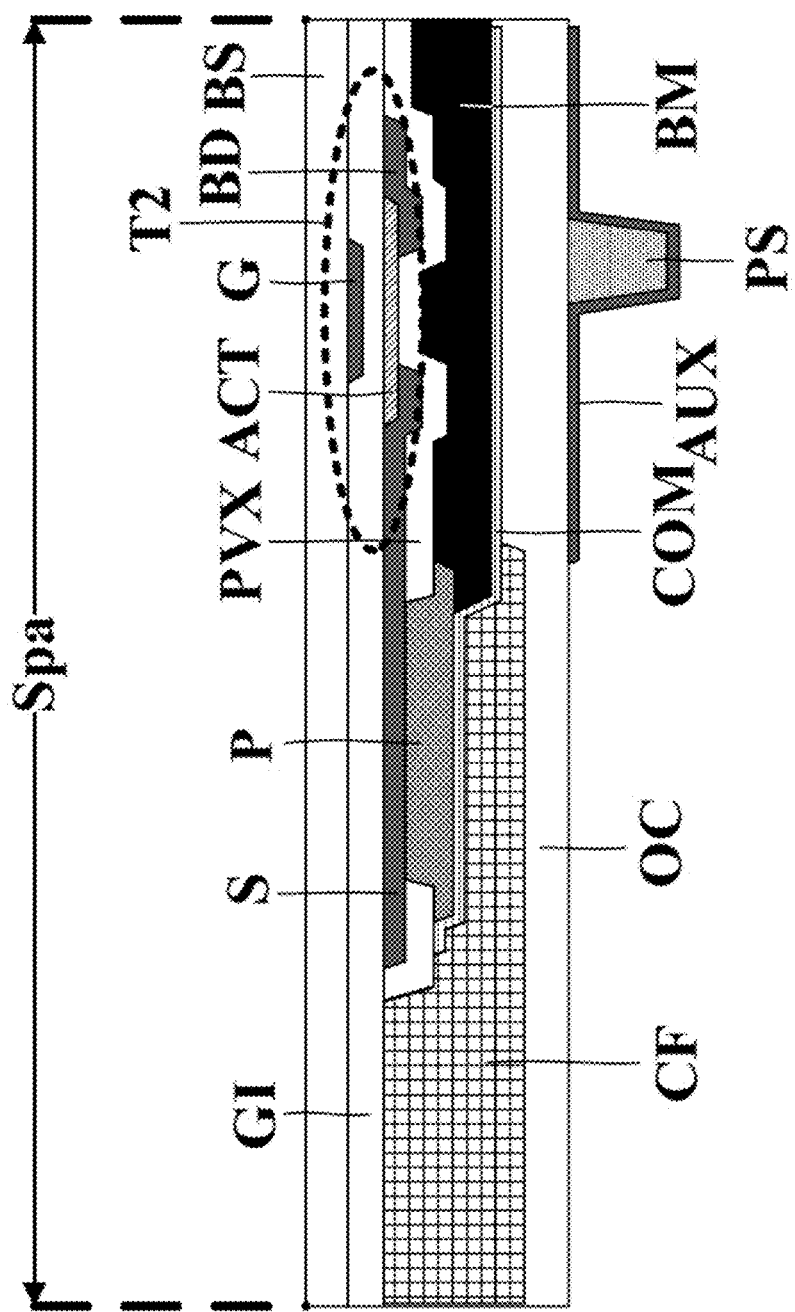
FIG. 4 is a cross-sectional view of a subpixel area of a counter substrate in a display panel in some embodiments according to the present disclosure.

FIG. 4 is a cross-sectional view of a subpixel area of a counter substrate in a display panel in some embodiments according to the present disclosure. Referring to FIG. 4, the counter substrate in some embodiments includes a base substrate BS; a plurality of second thin film transistors T2 on the base substrate BS and respectively in the plurality of subpixel areas Spa; and a plurality of photosensors P respectively connected to the plurality of second thin film transistors T2 and respectively in the plurality of subpixel areas Spa. Optionally, the plurality of photosensors P are configured to detect actual light emitting brightness values of the plurality of subpixel areas Spa respectively.

Optionally, and referring to FIG. 4, the plurality of second thin film transistors T2 are a plurality of bottom gate-type thin film transistors. Optionally, each of the plurality of second thin film transistors T2 includes a gate electrode G on the base substrate BS, a gate insulating layer GI on a side of the gate electrode G distal to the base substrate BS, an active layer ACT on a side of the gate insulating layer GI distal to the gate electrode G, a source electrode S and a drain electrode D on a side of the active layer ACT distal to the base substrate BS.

Optionally, the plurality of second thin film transistors T2 are a plurality of top gate-type thin film transistors. Optionally, each of the plurality of second thin film transistors T2 includes an active layer ACT on the base substrate BS, a gate insulating layer GI on a side of the active layer ACT distal to the base substrate BS, a gate electrode G on a side of the gate insulating layer GI distal to on the active layer ACT, a source electrode S and a drain electrode D on a side of the gate electrode G distal to the base substrate BS and connected to the active layer ACT through vias extending through the gate insulating layer GI.

Optionally, the plurality of second thin film transistors 12 are a plurality of back channel etch-type thin film transistors. Optionally, each of the plurality of second thin film transistors 12 further includes a barrier layer on a side of the active layer distal to the gate electrode, the barrier layer formed by a back channel etch process.

Optionally, the plurality of second thin film transistors T2 are a plurality of etch stop layer-type thin film transistors. Optionally, each of the plurality of second thin film transistors 12 further includes an etch stop layer on a side of the active layer distal to the gate electrode.

Referring to FIG. 4 again, the counter substrate in some embodiments further includes a common electrode COM configured to be provided with a common voltage signal. For example, the common voltage signal may be a low voltage signal that sets the one of the plurality of photosensors P in a reversely biased state. Optionally, the common voltage signal has a voltage level in a range of approximately −10 V to 0 V, e.g., −5 V to 0 V. Referring to FIGS. 2 to 4, when the one of the plurality of second thin film transistors T2 is switched off the photoelectrons generated in the one of the plurality of photosensors P connected to the one of the plurality of second thin film transistors T2 causes a reduction of voltage level between the first polarity region PR1 and the second polarity region PR2. Different numbers of photoelectrons generated by different photosensors result in different degrees of voltage level reduction. When the one of the plurality of second thin film transistors T2 is turned on again, the remaining voltages at the second polarity region PR2 produce a photocurrent, which is transmitted to the compensation circuit C through one of the plurality of read lines R. Based on the photocurrent, the actual light emitting brightness value corresponding to the one of the plurality of subpixel areas Spa can be determined, and is compared with a target brightness value. The compensation circuit C is configured to adjust in real time the actual light emitting brightness value of each of the plurality of subpixel areas to the target brightness value.

Referring to FIG. 2 and FIG. 4, the counter substrate further includes a plurality of read lines R for respectively transmitting signals detected by the plurality of actual light emitting brightness value detectors BD to, e.g., a compensation circuit C configured to adjust in real time the actual light emitting brightness values of the plurality of subpixel areas to the target brightness values. Accordingly, a display apparatus having the display panel described herein in some embodiments further includes a compensation circuit C connected to the plurality of read lines R, and configured to adjust in real time the actual light emitting brightness values of each of the plurality of subpixel areas Spa to the target brightness values.

Referring to FIG. 3 and FIG. 4, in some embodiments, the source electrode S of one of the plurality of second thin film transistors T2 is connected to the second polarity region PR2 of one of the plurality of photosensors P, and the common electrode COM is connected to the first polarity region PR1 of one of the plurality of photosensors P. The drain electrode D of one of the plurality of second thin film transistors T2 is connected to one of the plurality of read lines R.

In some embodiments, and referring to FIG. 4, the common electrode COM is an integral electrode block extending throughout the counter substrate. The integral electrode block is commonly connected to first polarity regions of the plurality of photosensors P. Optionally, the display panel further includes a common voltage signal line connected to the integral electrode block and configured to provide the common voltage signal to the integral electrode block. Optionally, the common voltage signal line is disposed in a peripheral region of the counter substrate.

Figure 5:
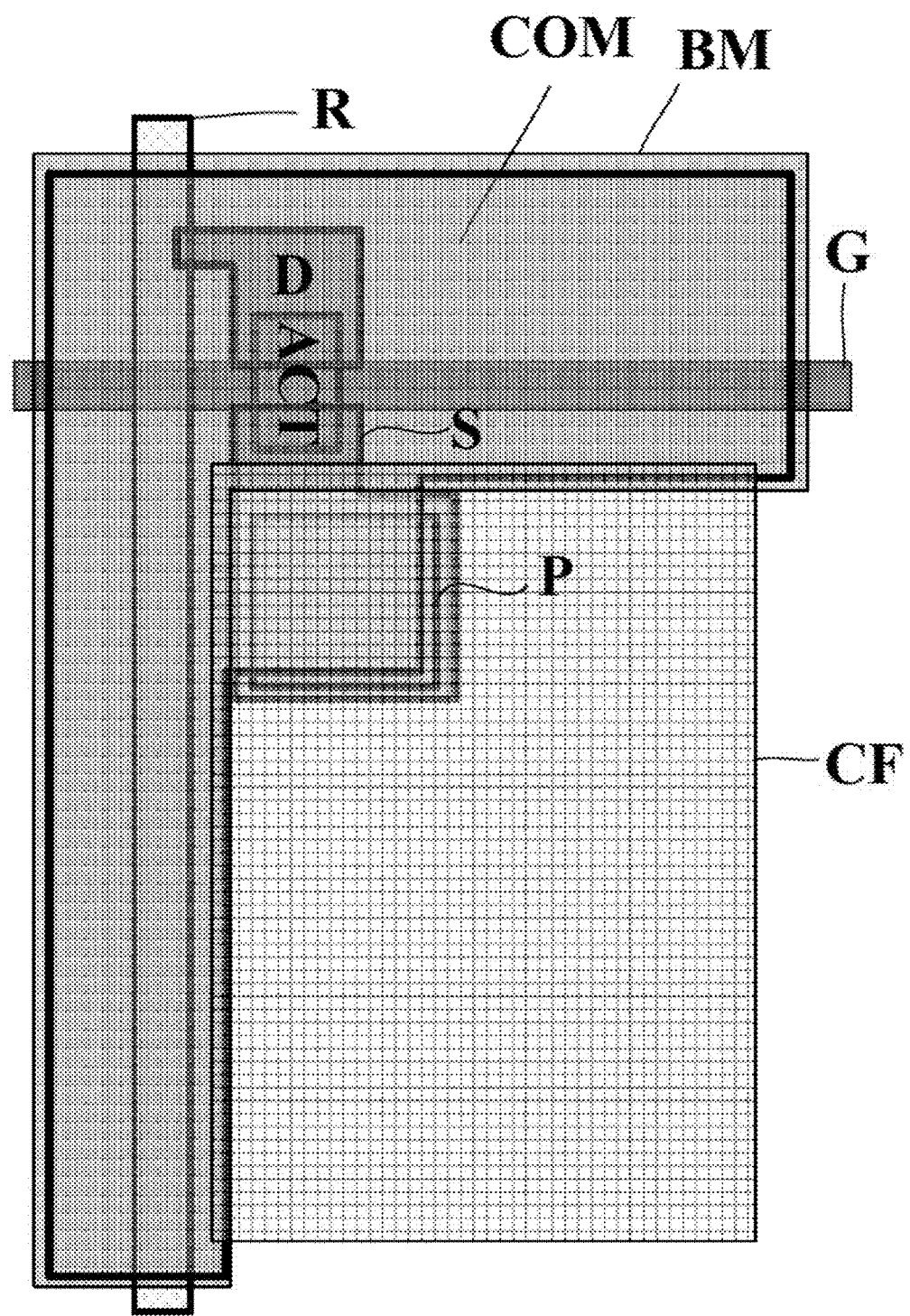
FIG. 5 is a perspective plan view of a subpixel area of a counter substrate in a display panel in some embodiments according to the present disclosure.

In some embodiments, the display panel further includes a black matrix BM. FIG. 5 is a perspective plan view of a subpixel area of a counter substrate in a display panel in some embodiments according to the present disclosure. Referring to FIG. 4 and FIG. 5, an orthographic projection of the integral electrode block on the base substrate BS at least partially overlaps with an orthographic projection of the black matrix BM on the base substrate BS. Further, the orthographic projection of the integral electrode block on the base substrate BS also partially overlaps with an orthographic projection of one of a plurality of photosensors P on the base substrate BS. Optionally, the orthographic projection of the integral electrode block on the base substrate BS substantially covers the orthographic projection of one of a plurality of photosensors P on the base substrate BS.

In some embodiments, the display panel further includes a passivation layer PVX on a side of the source electrode S and the drain electrode D distal to the base substrate BS.

Figure 6:
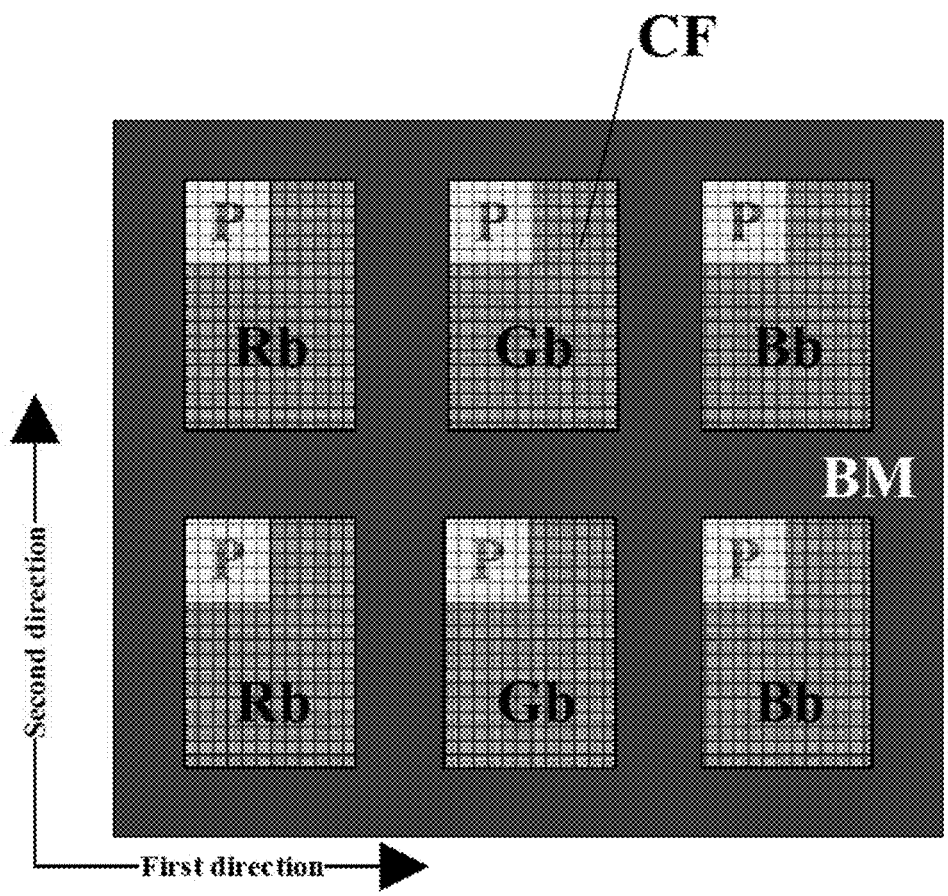
FIG. 6 is a perspective plan view of a counter substrate in a display panel in some embodiments according to the present disclosure.
Figure 7:
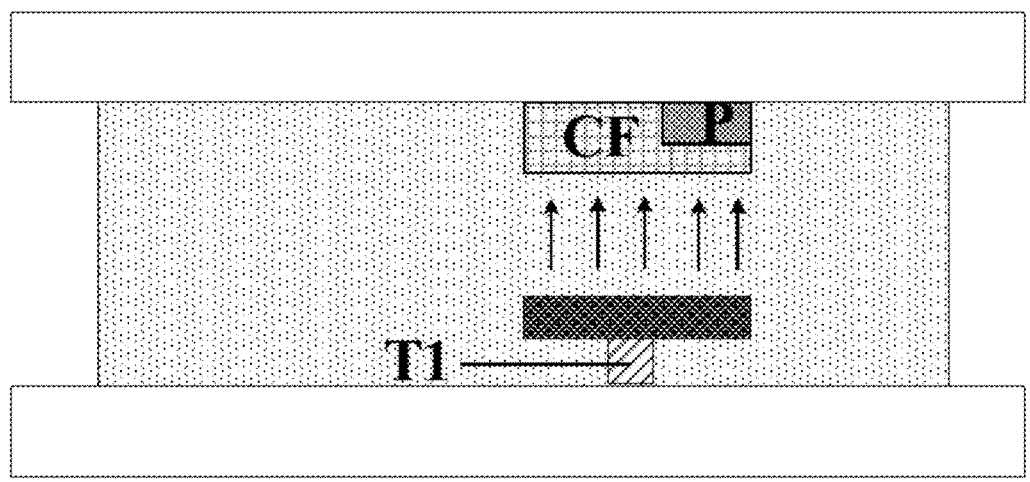
FIG. 7 is a cross-sectional view of a display panel in some embodiments according to the present disclosure.

FIG. 6 is a perspective plan view of a counter substrate in a display panel in some embodiments according to the present disclosure. FIG. 7 is a cross-sectional view of a display panel in some embodiments according to the present disclosure. Referring to FIGS. 4 to 7, the counter substrate in some embodiments further includes a plurality of color filter blocks CF (e.g., a red color filter block Rb, a green color filter block Gb, and a blue color filter block Bb). Optionally, the plurality of photosensors P are respectively between the plurality of color filter blocks CF and the base substrate BS. Optionally, an orthographic projection of one of a plurality of color filter blocks CF on the base substrate BS at least partially overlaps (e.g., at least 50%, at least 60%, at least 70%, at least 80%, at least 90%, at least 95%, and at least 99%) with an orthographic projection of one of a plurality of photosensors P on the base substrate BS. Optionally, an orthographic projection of one of a plurality of color filter blocks CF on the base substrate BS substantially covers an orthographic projection of one of a plurality of photosensors P on the base substrate BS.

By having the plurality of photosensors P respectively between the plurality of color filter blocks CF and the base substrate BS (e.g., by having the orthographic projection of each individual one of the plurality of photosensors P on the base substrate BS at least partially overlaps with an orthographic projection of a respective one of the plurality of color filter blocks CF on the base substrate BS), the brightness value of the light sensed by the plurality of photosensors P can be a good representative of the actual light emitting brightness value.

Figure 8:
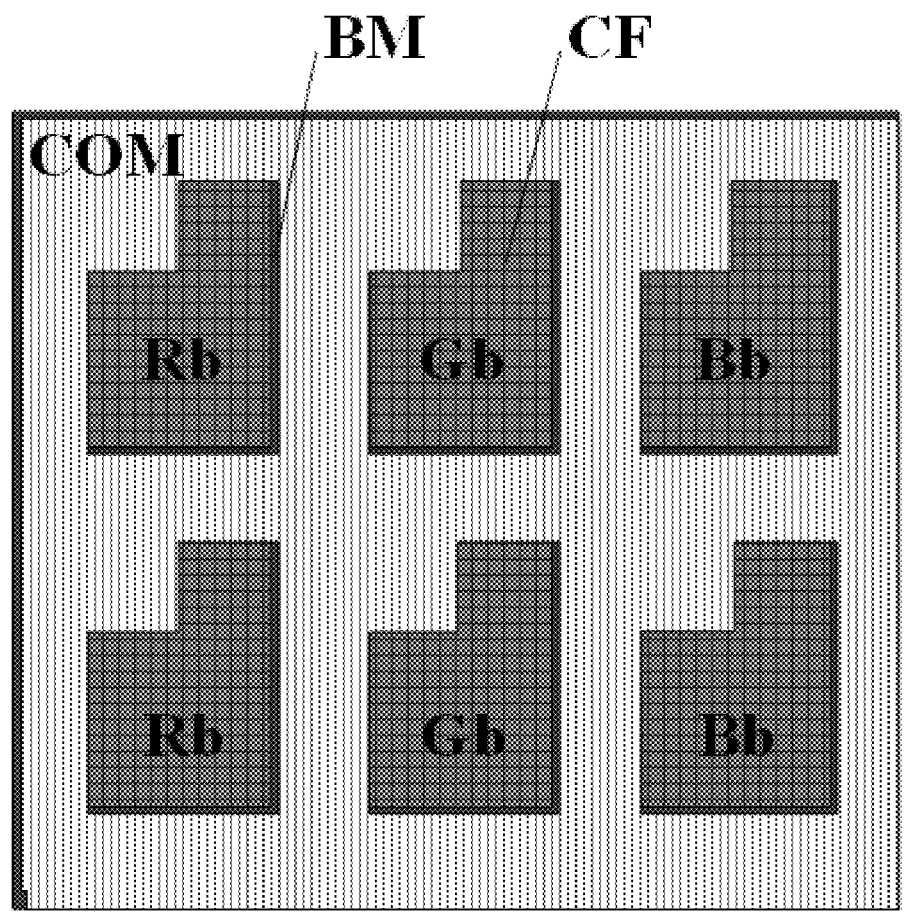
FIG. 8 is a perspective plan view of a counter substrate in a display panel in some embodiments according to the present disclosure.

Referring to FIG. 6, the black matrix in some embodiments includes a plurality of black matrix rows and a plurality of black matrix columns intersecting each other. As shown in FIG. 6, the plurality of black matrix rows are substantially along a first direction, the plurality of black matrix columns are substantially along a second direction different from the first direction. FIG. 8 is a perspective plan view of a counter substrate in a display panel in some embodiments according to the present disclosure. Referring to FIG. 8, in some embodiments, an orthographic projection of the common electrode COM (formed as an integral electrode block) on the base substrate BS at least partially (e.g., at least 50%, at least 60%, at least 70%, at least 80%, at least 90%, at least 95%, and at least 99%) overlaps with an orthographic projection of each of the plurality of black matrix rows on the base substrate BS, and at least partially overlaps with an orthographic projection of each of the plurality of black matrix columns on the base substrate BS. The common electrode COM forms a grid, and has a shape similar to that of the black matrix BM, except that the common electrode COM has a plurality of additional portions that at least partially covers (e.g., substantially covers) the plurality of photosensors P, respectively.

Figure 9:
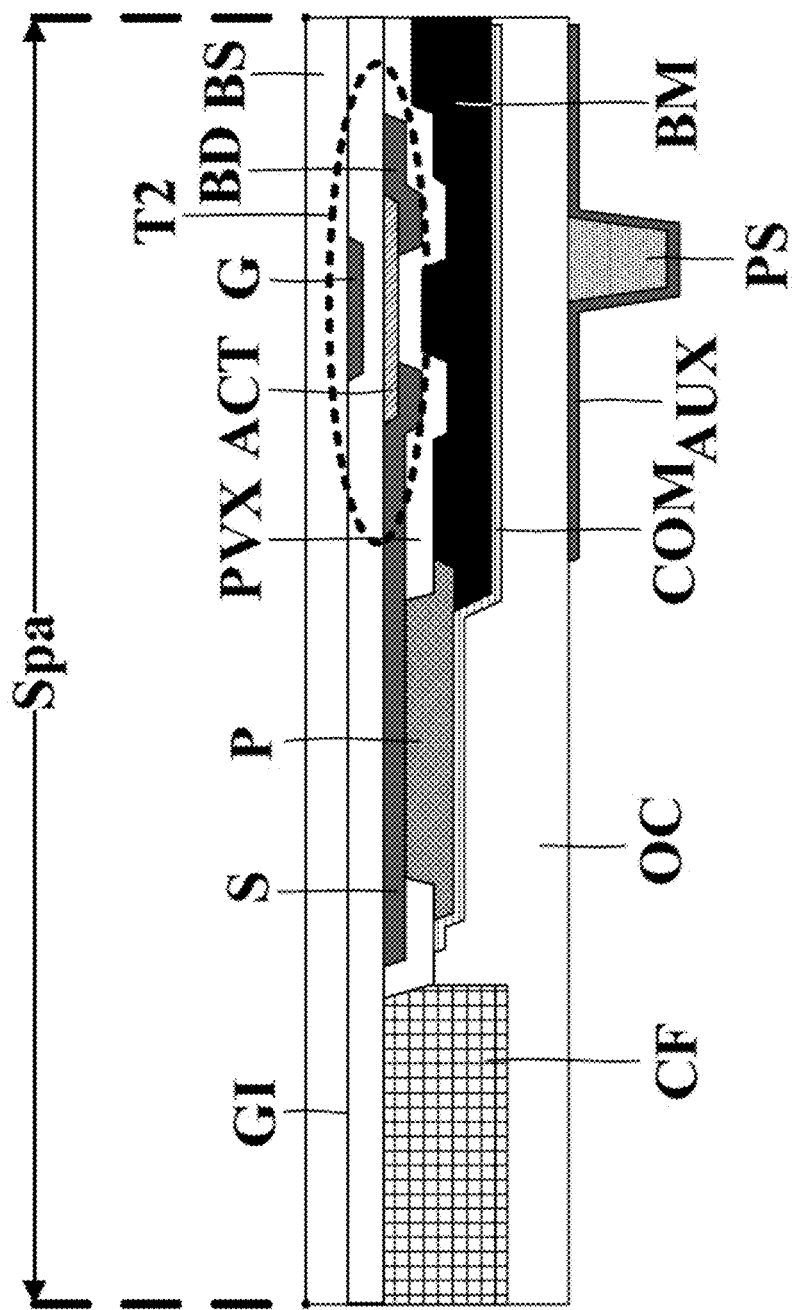
FIG. 9 is a cross-sectional view of a subpixel area of a counter substrate in a display panel in some embodiments according to the present disclosure.

FIG. 9 is a cross-sectional view of a subpixel area of a counter substrate in a display panel in some embodiments according to the present disclosure. Referring to FIG. 9, in some embodiments, the plurality of photosensors P are not between the plurality of color filter blocks CF and the base substrate BS, e.g., the orthographic projection of the plurality of photosensors P on the base substrate BS is substantially non-overlapping with the orthographic projection of the plurality of color filter blocks CF on the base substrate BS. The light sensed by the plurality of photosensors P is unfiltered. Optionally, the brightness value of the light sensed by the plurality of photosensors P can be converted into the actual light emitting brightness value by a conversion algorithm. By having this design, the display panel can have a higher aperture ratio.

Figure 10:
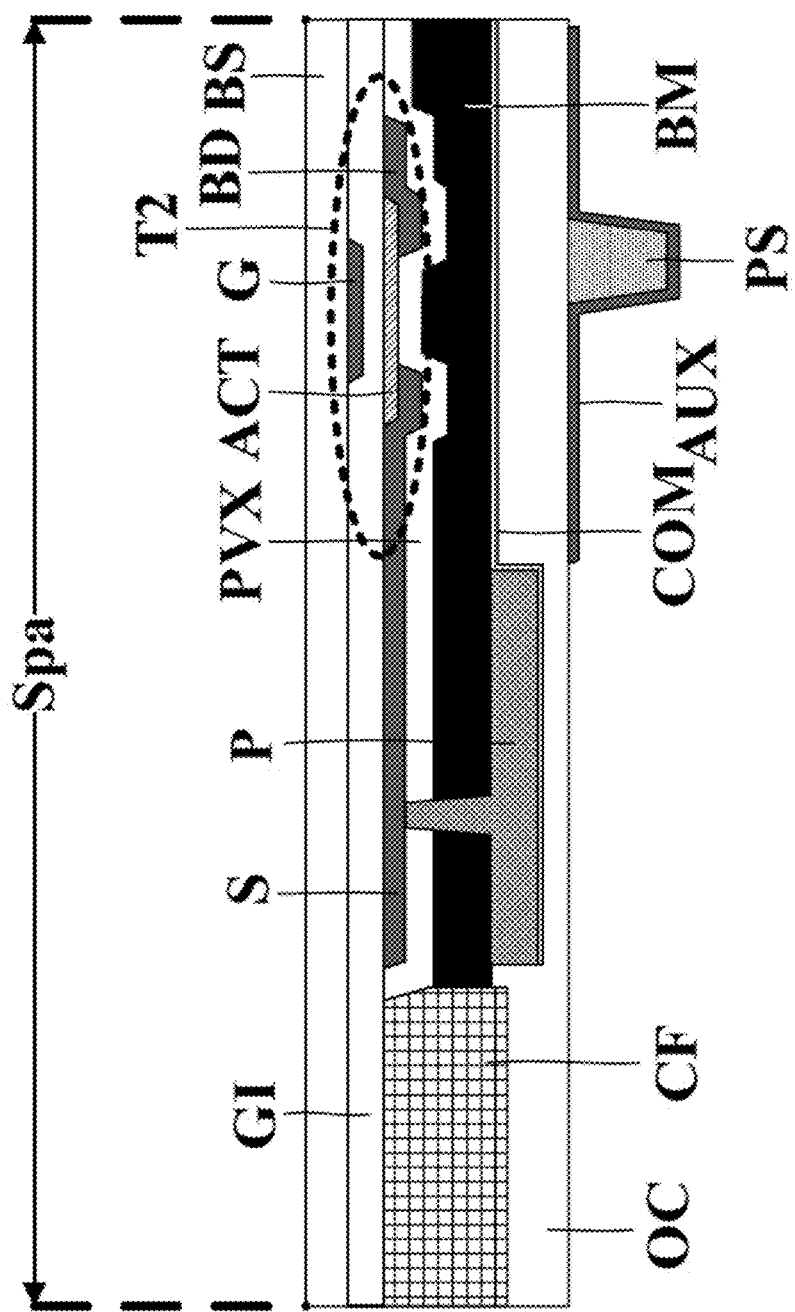
FIG. 10 is a cross-sectional view of a subpixel area of a counter substrate in a display panel in some embodiments according to the present disclosure.

FIG. 10 is a cross-sectional view of a subpixel area of a counter substrate in a display panel in some embodiments according to the present disclosure. Referring to FIG. 10, in some embodiments, each of the plurality of photosensors P is on a side of the black matrix BM distal to the base substrate BS. The orthographic projection of the plurality of photosensors P on the base substrate BS is substantially non-overlapping with the orthographic projection of the plurality of color filter blocks CF on the base substrate BS.

Figure 11:
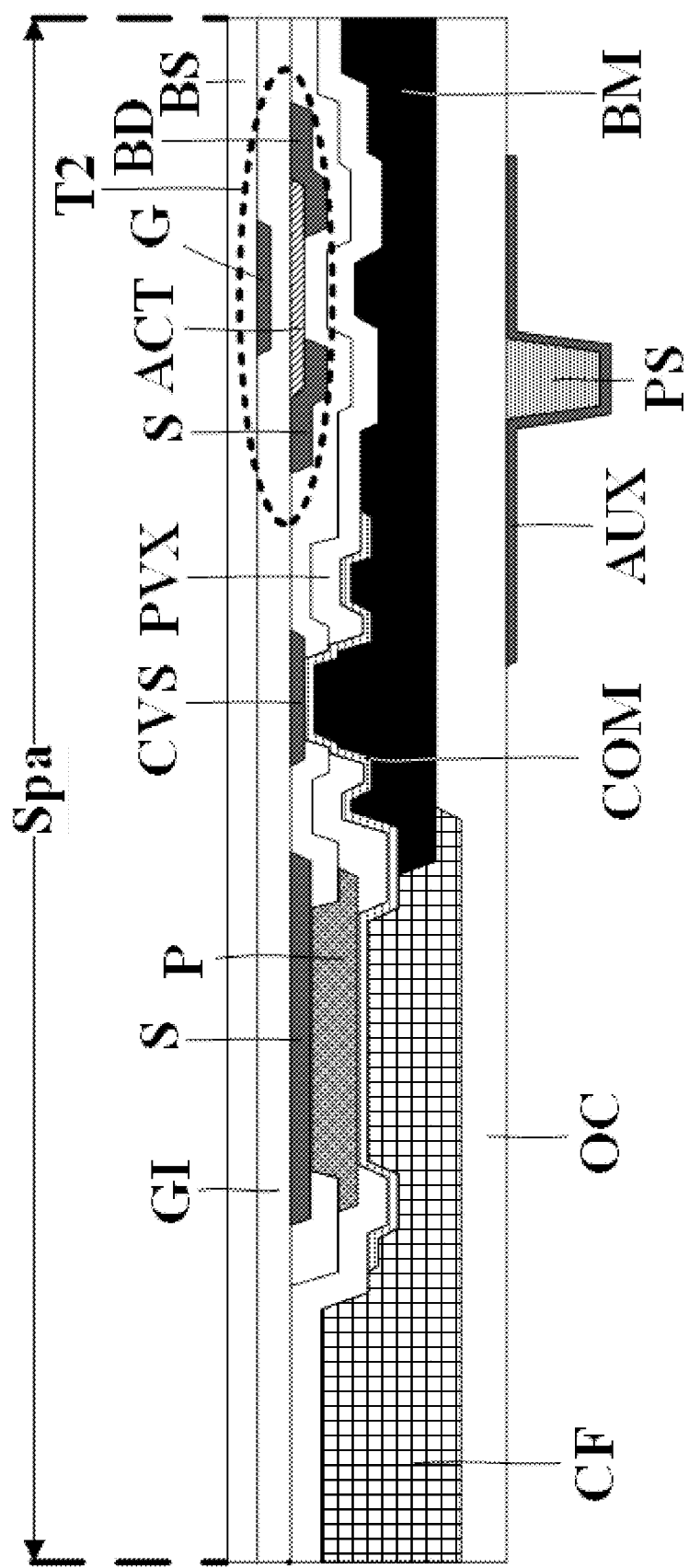
FIG. 11 is a cross-sectional view of a subpixel area of a counter substrate in a display panel in some embodiments according to the present disclosure.
Figure 12:
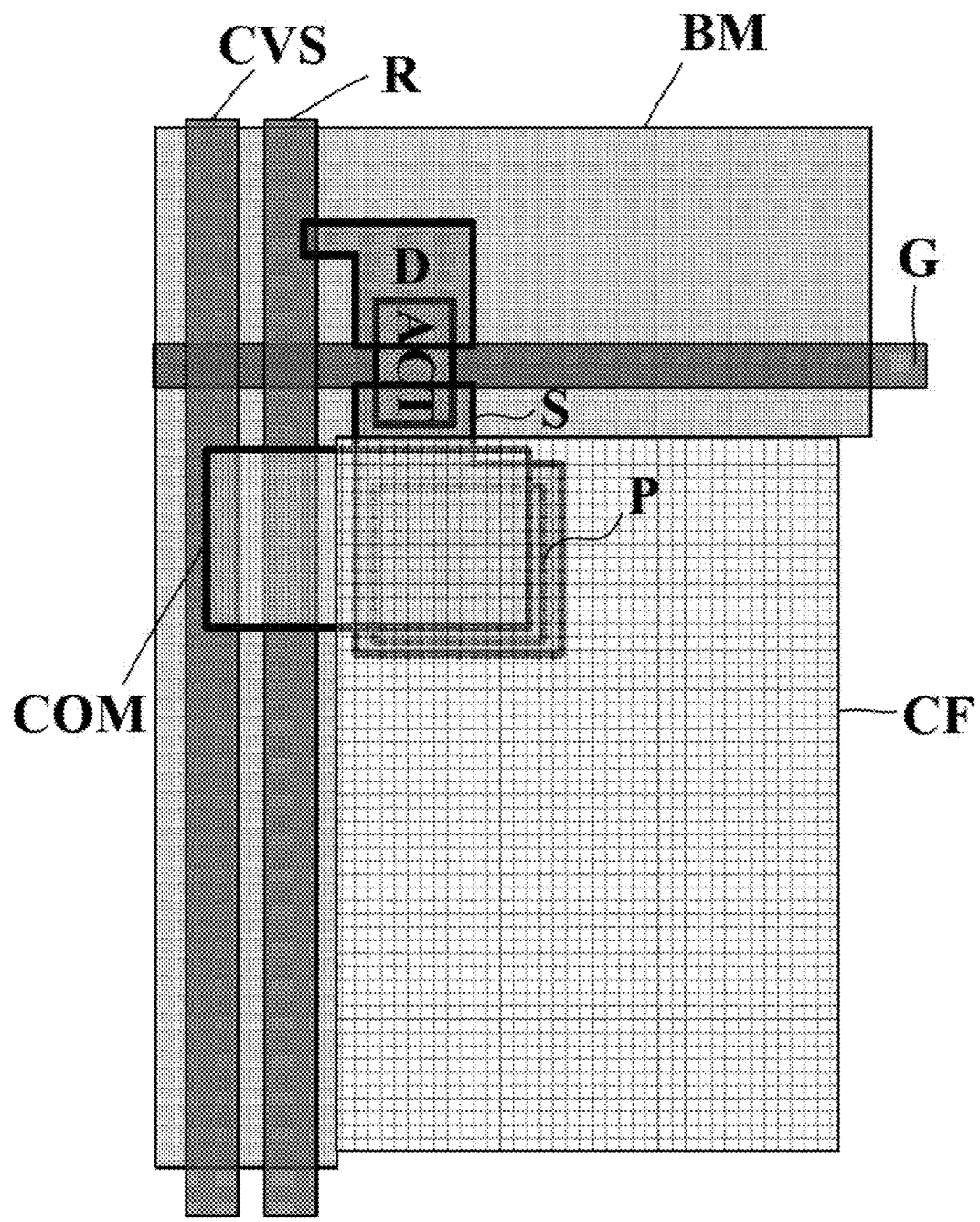
FIG. 12 is a perspective plan view of a subpixel area of a counter substrate in a display panel in some embodiments according to the present disclosure.

FIG. 11 is a cross-sectional view of a subpixel area of a counter substrate in a display panel in some embodiments according to the present disclosure. FIG. 12 is a perspective plan view of a subpixel area of a counter substrate in a display panel in some embodiments according to the present disclosure. Referring to FIG. 11 and FIG. 12, the common electrode COM is not an integral electrode block, but includes a plurality of common electrode blocks. Referring to FIG. 3, FIG. 11, and FIG. 12, each of the plurality of common electrode blocks is electrically connected to the first polarity region PR1 of one of the plurality of photosensors P. As shown in FIG. 11 and FIG. 12, the display panel further includes a plurality of common voltage signal lines CVS respectively connected to the plurality of common electrode blocks, and configured to provide the common voltage signal to the plurality of common electrode blocks. Optionally, and referring to FIG. 12, the plurality of common voltage signal lines CVS and the plurality of read lines R are substantially along a same direction. By having the plurality of common voltage signal lines CVS for transmitting the common voltage signal respectively to the plurality of common electrode blocks, the issue of current-resistance (IR) drop can be obviated. Optionally, an orthographic projection of the black matrix BM on the base substrate BS substantially covers an orthographic projection of the plurality of common voltage signal lines CVS on the base substrate BS.

Referring to FIG. 4 and FIG. 11, in some embodiments, an orthographic projection of the common electrode COM on the base substrate BS partially overlaps with an orthographic projection of one of the plurality of photosensors P on the base substrate BS, and a portion of the common electrode COM is between one of the plurality of color filter blocks CF and one of the plurality of photosensors P in a same one of the plurality of subpixel areas Spa.

Optionally, the common electrode COM is a substantially transparent electrode. As used herein, the term "substantially transparent" means at least 50 percent (e.g., at least 60 percent, at least 70 percent, at least 80 percent, at least 90 percent, and at least 95 percent) of light in the visible wavelength range transmitted therethrough.

Referring to FIGS. 4, and 9 to 11, the counter substrate in some embodiments further includes an overcoat layer OC on a side of the plurality of second thin film transistors T2 and the plurality of photosensors P distal to the base substrate BS. In some embodiments, the counter substrate further includes a spacer layer PS on a side of the overcoat layer OC distal to the base substrate BS. Optionally, the counter substrate further includes an auxiliary cathode AUX on a side of the space layer PS distal to the base substrate BS.

Optionally, the display panel is an organic light emitting diode display panel having a plurality of organic light emitting diodes. Optionally, the plurality of actual light emitting brightness value detectors BD are configured to detect actual light emitting brightness values of the plurality of organic light emitting diodes respectively.

Optionally, the display panel is a quantum dots light emitting diode display panel having a plurality of quantum dots light emitting diodes. Optionally, the plurality of actual light emitting brightness value detectors BD are configured to detect actual light emitting brightness values of the plurality of quantum dots light emitting diodes respectively.

Optionally, the display panel is a micro light emitting diode display panel having a plurality of micro light emitting diodes. Optionally, the plurality of actual light emitting brightness value detectors BD are configured to detect actual light emitting brightness values of the plurality of micro light emitting diodes respectively.

In another aspect, the present disclosure provides a display substrate (e.g., a counter substrate) having a plurality of subpixel areas. In some embodiments, the display substrate includes a plurality of actual light emitting brightness value detectors integrated in the display substrate and respectively in the plurality of subpixel areas. Referring to FIG. 4, the display substrate in some embodiments includes a base substrate BS; a plurality of second thin film transistors T2 on the base substrate BS and respectively in the plurality of subpixel areas Spa; and a plurality of photosensors P respectively connected to the plurality of second thin film transistors T2 and respectively in the plurality of subpixel areas Spa. Optionally, the plurality of photosensors P are configured to detect actual light emitting brightness values of the plurality of subpixel areas Spa respectively. Referring to FIG. 1 and FIG. 2, each of the plurality of actual light emitting brightness value detectors BD includes one of a plurality of second thin film transistors T2 and one of the plurality of photosensors P electrically connected to each other. The source electrode of the one of the plurality of second thin film transistors T2 is electrically connected to the one of the plurality of photosensors P. The drain electrode of the one of the plurality of second fin transistors T2 is electrically connected to one of a plurality of read line R. A terminal of the one of the plurality of photosensors P is configured to be provided with a common voltage Vo. Referring to FIG. 3, each of the plurality of photosensors P in some embodiments includes a first polarity region PR1 connected to a common electrode COM, a second polarity region PR2 connected to a source electrode S of one of the plurality of second thin film transistors T2, and a diode junction J connecting the first polarity region PR1 and the second polarity region PR2. As used herein, the term diode junction refers to a junction that can exhibit current rectification, e.g., a junction that exhibits drastically different conductivities in one bias direction relative to the other.

Referring to FIG. 4, the display substrate in some embodiments further includes a common electrode COM configured to be provided with a common voltage signal, and a plurality of read lines R for respectively transmitting signals detected by the plurality of actual light emitting brightness value detectors BD. In some embodiments, and referring to FIG. 3 and FIG. 4, each of the plurality of photosensors P includes a first polarity region PR1 connected to the common electrode COM, a second polarity region PR2 connected to a source electrode S of one of the plurality of second thin film transistors T2, and a diode junction J connecting the first polarity region PR1 and the second polarity region PR2. Optionally, and referring to FIG. 4, each of the plurality of second thin film transistors includes a gate electrode G, a source electrode S connected to a second polarity region PR2 of one of the plurality of photosensors P, and a drain electrode D connected to one of the plurality of read lines R.

Referring to FIGS. 3 to 8, the common electrode in some embodiments is an integral electrode block extending throughout the display substrate. The integral electrode block is electrically connected to first polarity regions PR1 of the plurality of photosensors P. The display substrate further includes a common voltage signal line connected to the integral electrode block and configured to provide the common voltage signal to the integral electrode block.

Referring to FIGS. 4, 6, and 8, the display substrate in some embodiments further includes a black matrix BM. Referring to FIG. 6, the black matrix in some embodiments includes a plurality of black matrix rows and a plurality of black matrix columns intersecting each other. As shown in FIG. 6, the plurality of black matrix rows are substantially along a first direction, the plurality of black matrix columns are substantially along a second direction different from the first direction. Referring to FIG. 8, in some embodiments, an orthographic projection of the common electrode COM on the base substrate BS at least partially overlaps with an orthographic projection of each of the plurality of black matrix rows on the base substrate BS, and at least partially overlaps with an orthographic projection of each of the plurality of black matrix columns on the base substrate BS.

Referring to FIG. 11 and FIG. 12, the common electrode COM in some embodiments includes a plurality of common electrode blocks. Referring to FIG. 3, FIG. 11, and FIG. 12, each of the plurality of common electrode blocks is electrically connected to the first polarity region PR1 of one of the plurality of photosensors P. As shown in FIG. 11 and FIG. 12, the display substrate further includes a plurality of common voltage signal lines CVS respectively connected to the plurality of common electrode blocks, and configured to provide the common voltage signal to the plurality of common electrode blocks. Optionally, the plurality of common voltage signal lines CVS and the plurality of read lines R are substantially along a same direction.

Referring to FIGS. 4 to 7, the display substrate in some embodiments further includes a plurality of color filter blocks CF. Optionally, the plurality of photosensors P are respectively between the plurality of color filter blocks CF and the base substrate BS. Optionally, an orthographic projection of one of a plurality of color filter blocks CF on the base substrate BS at least partially overlaps with an orthographic projection of one of a plurality of photosensors P on the base substrate BS. Optionally, an orthographic projection of one of a plurality of color filter blocks CF on the base substrate BS substantially covers an orthographic projection of one of a plurality of photosensors P on the base substrate BS.

Referring to FIG. 4 and FIG. 11, in some embodiments, an orthographic projection of the common electrode COM on the base substrate BS partially overlaps with an orthographic projection of one of the plurality of photosensors P on the base substrate BS, and a portion of the common electrode COM is between one of the plurality of color filter blocks CF and one of the plurality of photosensors P in a same one of the plurality of subpixel areas Spa.

Referring to FIGS. 4, and 9 to 11, the display substrate in some embodiments further includes an overcoat layer OC on a side of the plurality of second thin film transistors T2 and the plurality of photosensors P distal to the base substrate BS. In some embodiments, the display substrate further includes a spacer layer PS on a side of the overcoat layer OC distal to the base substrate BS. Optionally, the display substrate further includes an auxiliary cathode AUX on a side of the space layer PS distal to the base substrate BS.

In some embodiments, the display substrate is a counter substrate.

In some embodiments, the display substrate is an array substrate. Optionally, the display substrate is an organic light emitting diode display substrate including an encapsulating layer which encapsulates the organic light emitting diode display substrate.

In some embodiments, the display substrate is an array substrate. Optionally, the display substrate is an array substrate including a color filter (e.g., a color-on-array type army substrate). Optionally, the color filter in the array substrate includes a plurality of color filter blocks. The plurality of photosensors are respectively between the plurality of color filter blocks and the base substrate. Optionally, an orthographic projection of each individual one of the plurality of photosensors on the base substrate at least partially overlaps with an orthographic projection of a respective one of the plurality of color filter blocks on the base substrate.

In another aspect, the present disclosure provides a method of fabricating a display panel having a plurality of subpixels. In some embodiments, the method includes forming an array substrate having an array of a plurality of first thin film transistors respectively in the plurality of subpixels for driving light emission of the display panel; forming a counter substrate facing the array substrate and having a plurality of subpixel areas respectively in the plurality of subpixels; and forming an optical compensation device for adjusting in real time an actual light emitting brightness value of each of the plurality of subpixel areas to a target brightness value. Optionally, forming the optical compensation device includes forming a plurality of actual light emitting brightness value detectors integrated in the counter substrate and respectively in the plurality of subpixel areas.

In some embodiments, the step of forming the counter substrate includes forming a plurality of second thin film transistors on a base substrate and respectively in the plurality of subpixel areas; and forming a plurality of photosensors respectively connected to the plurality of second thin film transistors and respectively in the plurality of subpixel areas. The plurality of photosensors are configured to detect actual light emitting brightness values of the plurality of subpixel areas respectively. Optionally, each of the plurality of actual light emitting brightness value detectors is formed to include one of the plurality of second thin film transistors and one of the plurality of photosensors electrically connected to each other.

In some embodiments, the method further includes forming a common electrode configured to be provided with a common voltage signal; forming a plurality of read lines for respectively transmitting signals detected by the plurality of actual light emitting brightness value detectors; and forming a compensation circuit connected to the plurality of read lines, and configured to adjust in real time the actual light emitting brightness value of each of the plurality of subpixel areas to the target brightness value.

Optionally, each of the plurality of photosensors is formed to include a first polarity region connected to the common electrode, a second polarity region connected to a source electrode of one of the plurality of second thin film transistors, and a diode junction connecting the first polarity region and the second polarity region. Optionally, each of the plurality of second thin film transistors is formed to include a gate electrode, a source electrode connected to a second polarity region of one of the plurality of photosensors, and a drain electrode connected to one of the plurality of read lines.

In some embodiments, the step of forming the common electrode includes forming an integral electrode block extending throughout the counter substrate. The integral electrode block is formed to be electrically connected to first polarity regions of the plurality of photosensors. Optionally, the method further includes forming a common voltage signal line connected to the integral electrode block and configured to provide the common voltage signal to the integral electrode block.

In some embodiments, the method further includes forming a black matrix. The black matrix is formed to include a plurality of black matrix rows and a plurality of black matrix columns intersecting each other, the plurality of black matrix rows substantially along a first direction, the plurality of black matrix columns substantially along a second direction different from the first direction. Optionally, the common electrode and the black matrix are formed so that an orthographic projection of the integral electrode block on the base substrate at least partially overlaps with an orthographic projection of each of the plurality of black matrix rows on the base substrate, and at least partially overlaps with an orthographic projection of each of the plurality of black matrix columns on the base substrate.

In some embodiments, the step of forming the common electrode includes forming a plurality of common electrode blocks. Each of the plurality of common electrode blocks is formed to be electrically connected to the first polarity region of one of the plurality of photosensors. Optionally, the method further includes forming a plurality of common voltage signal lines respectively connected to the plurality of common electrode blocks, and configured to provide the common voltage signal to the plurality of common electrode blocks. Optionally, the plurality of common voltage signal lines and the plurality of read lines are formed substantially along a same direction.

In some embodiments, the step of forming the counter substrate further includes forming a plurality of color filter blocks. The plurality of photosensors are formed respectively between the plurality of color filter blocks and the base substrate. Optionally, the plurality of photosensors and the plurality of color filter blocks are formed so that an orthographic projection of each individual one of the plurality of photosensors on the base substrate at least partially overlaps with an orthographic projection of a respective one of the plurality of color filter blocks on the base substrate.

In some embodiments, the method further includes forming a common electrode configured to be provided with a common voltage signal. Optionally, the common electrode and the plurality of photosensors are formed so that an orthographic projection of the common electrode on the base substrate partially overlaps with an orthographic projection of one of the plurality of photosensors. Optionally, the common electrode, the plurality of photosensors, and the plurality of color filter blocks are formed so that a portion of the common electrode is between one of the plurality of color filter blocks and one of the plurality of photosensors in a same one of the plurality of subpixel areas.

In some embodiments, the step of forming the counter substrate further includes forming an overcoat layer on a side of the plurality of second thin film transistors and the plurality of photosensors distal to the base substrate; and forming a spacer layer on a side of the overcoat layer distal to the base substrate. Optionally, the step of forming the counter substrate further includes forming an auxiliary cathode on a side of the space layer distal to the base substrate.

Optionally, the display panel is an organic light emitting diode display panel. Optionally, the method further includes forming a plurality of organic light emitting diodes. The plurality of actual light emitting brightness value detectors are configured to detect actual light emitting brightness values of the plurality of organic light emitting diodes respectively.

Figure 13A:
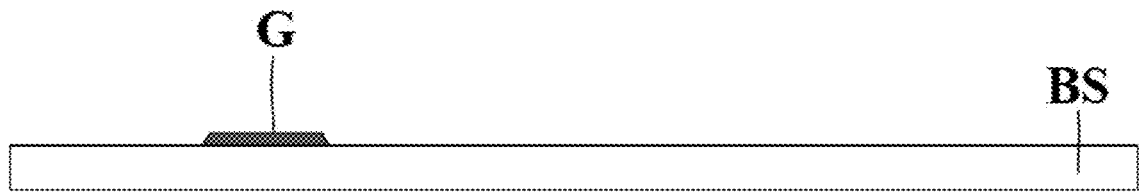
FIGS. 13A to 13F illustrate a process of fabricating a display substrate in some embodiments according to the present disclosure.
Figure 13B:
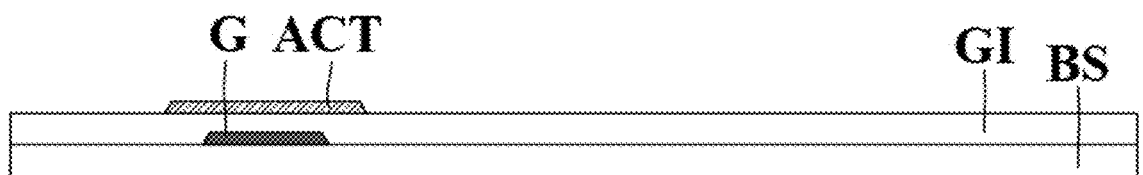

FIGS. 13A to 13F illustrate a process of fabricating a counter substrate in some embodiments according to the present disclosure. Referring to FIG. 13A, a gate electrode G is formed on a base substrate BS. Referring to FIG. 13B, a gate insulating layer GI is formed on a side of the gate electrode G distal to the base substrate BS, and an active layer ACT is formed on a side of the gate insulating layer GI distal to the gate electrode G.

Figure 13C:
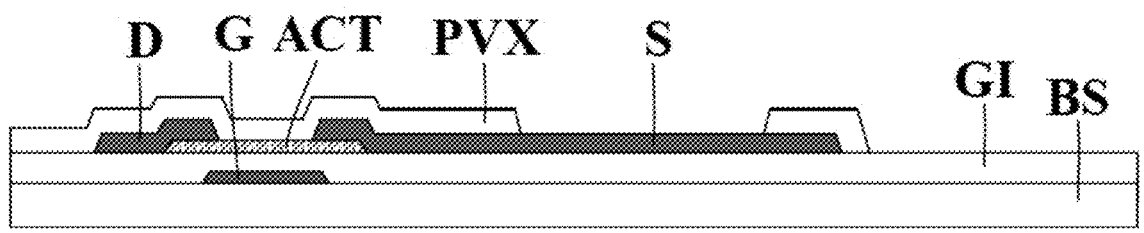

Referring to FIG. 13C, a source electrode S and a drain electrode D are formed on a side of the active layer ACT distal to the base substrate BS. A passivation layer PVX is formed on a side of the source electrode S and the drain electrode D distal to the base substrate BS. Moreover, a via is formed extending through the passivation layer PVX, exposing a portion of the source electrode S.

Figure 13D:
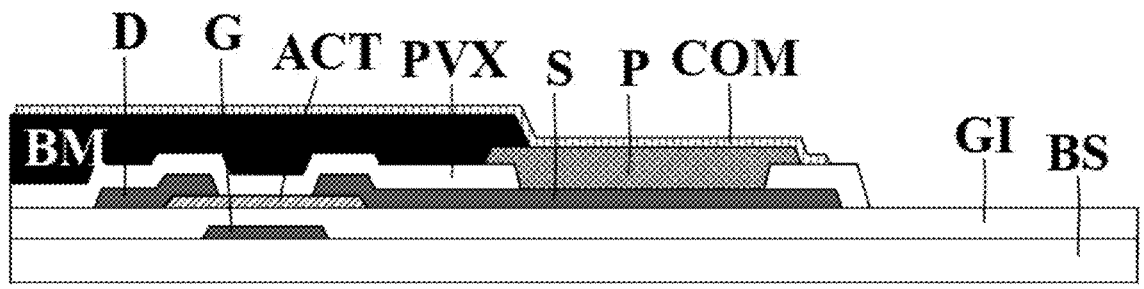

Referring to FIG. 13D, one of the plurality of photosensor P is formed on a side of the passivation layer PVX distal to the base substrate. The one of the plurality of photosensor P is electrically connected to the source electrode S through a via extending through the passivation layer PVX. Further, a black matrix BM is formed on a side of the passivation layer PVX distal to the base substrate BS. A common electrode COM is formed on a side of the black matrix BM and the one of the plurality of photosensors P distal to the base substrate BS.

Figure 13E:
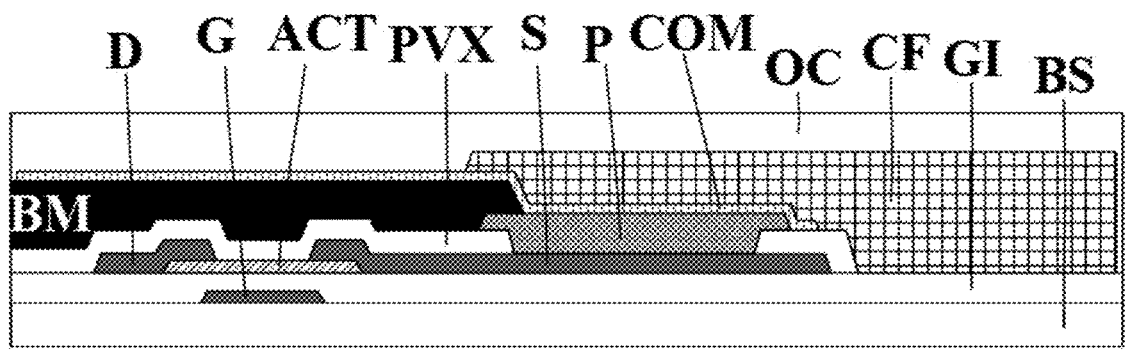

Referring to FIG. 13E, a plurality of color filter blocks CF are formed on a side of the common electrode COM distal to the base substrate BS, and substantially covers the common electrode COM. An overcoat layer OC is formed on a side of the plurality of color filter blocks CF, the black matrix BM, and the common electrode COM distal to the base substrate BS.

Figure 13F:
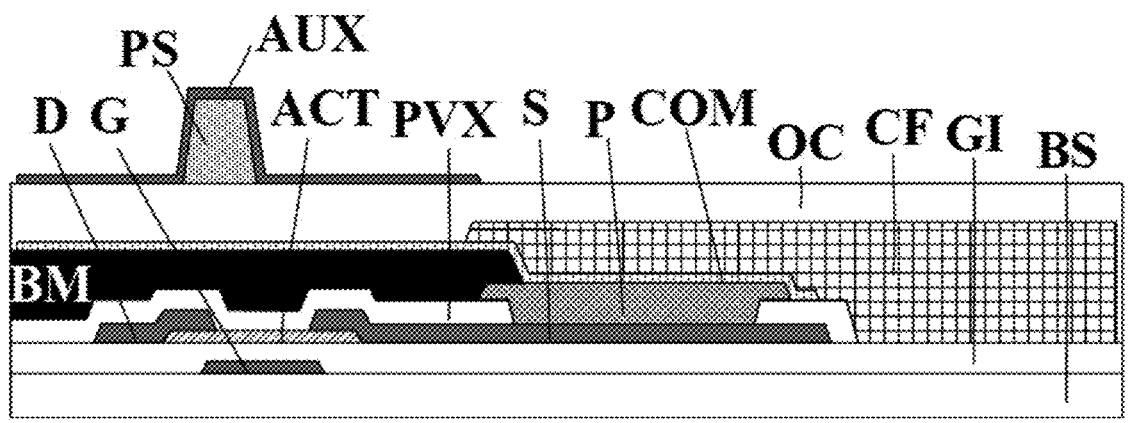

Referring to FIG. 13F, a spacer layer PS is formed on a side of the overcoat layer OC distal to the base substrate BS, and an auxiliary cathode AUX is formed on a side of the spacer layer PS distal to the base substrate BS.

In another aspect, the present disclosure provides a method of fabricating a display apparatus. In some embodiments, the method includes forming a display panel according to the method described herein, and forming a compensation circuit configured to receive in real time the actual light emitting brightness values of the plurality of subpixel areas, and configured to adjust in real time the actual light emitting brightness values of the plurality of subpixel areas to the target brightness values.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display panel having a plurality of subpixels, comprising:
an array substrate comprising an array of a plurality of first thin film transistors respectively in the plurality of subpixels for driving light emission of the display panel;
a counter substrate facing the array substrate and having a plurality of subpixel areas respectively in the plurality of subpixels; and
an optical compensation device for adjusting in real time actual light emitting brightness values of the plurality of subpixel areas to target brightness values;
wherein the optical compensation device comprises a plurality of actual light emitting brightness value detectors integrated in the counter substrate and respectively in the plurality of subpixel areas;
wherein the counter substrate comprises:
a base substrate;
a plurality of second thin film transistors on the base substrate and respectively in the plurality of subpixel areas; and
a plurality of photosensors respectively connected to the plurality of second thin film transistors and respectively in the plurality of subpixel areas, the plurality of photosensors configured to detect actual light emitting brightness values of the plurality of subpixel areas respectively;
wherein each of the plurality of actual light emitting brightness value detectors comprises one of the plurality of second thin film transistors and to one of the plurality of photosensors electrically connected to each other.

2. The display panel of claim 1, further comprising:
a plurality of read lines for respectively transmitting signals detected by the plurality of actual light emitting brightness value detectors; and
a compensation circuit connected to the plurality of read lines, and configured to adjust in real time the actual light emitting brightness values of the plurality of subpixel areas to the target brightness values.

3. The display panel of claim 2, further comprising a common electrode configured to be provided with a common voltage signal;
wherein each of the plurality of photosensors comprises a first polarity region connected to the common electrode, a second polarity region connected to a source electrode of one of the plurality of second thin film transistors, and a diode junction connecting the first polarity region and the second polarity region; and
each of the plurality of second thin film transistors comprises a gate electrode, a source electrode connected to a second polarity region of one of the plurality of photosensors, and a drain electrode connected to one of the plurality of read lines.

4. The display panel of claim 3, wherein the common electrode is an integral electrode block extending throughout the counter substrate; and
the integral electrode block is electrically connected to first polarity regions of the plurality of photosensors;
wherein the display panel further comprises a common voltage signal line connected to the integral electrode block and configured to provide the common voltage signal to the integral electrode block.

5. The display panel of claim 4, further comprising a black matrix;
wherein the black matrix comprises a plurality of black matrix rows and a plurality of black matrix columns intersecting each other, the plurality of black matrix rows substantially along a first direction, the plurality of black matrix columns substantially along a second direction; and
an orthographic projection of the integral electrode block on the base substrate at least partially overlaps with an orthographic projection of each of the plurality of black matrix rows on the base substrate, and at least partially overlaps with an orthographic projection of each of the plurality of black matrix columns on the base substrate.

6. The display panel of claim 3, wherein the common electrode comprises a plurality of common electrode blocks; and
each of the plurality of common electrode blocks is electrically connected to the first polarity region of one of the plurality of photosensors;
wherein the display panel further comprises a plurality of common voltage signal lines respectively connected to the plurality of common electrode blocks, and configured to provide the common voltage signal to the plurality of common electrode blocks.

7. The display panel of claim 6, wherein the plurality of common voltage signal lines and the plurality of read lines are substantially along a same direction.

8. The display panel of claim 3, wherein the plurality of second thin film transistors are a plurality of bottom gate, back channel etch-type thin film transistors;
each of the plurality of second thin film transistors further comprises an active layer, a barrier layer, and a gate insulating layer;
the active layer is on a side of the gate electrode distal to the base substrate;
the barrier layer is on a side of the active layer distal to the gate electrode, the barrier layer formed by a back channel etch process; and
the source electrode and the drain electrode are on a side of the active layer distal to the base substrate.

9. The display panel of claim 3, wherein the common electrode is a substantially transparent electrode.

10. The display panel of claim 3, wherein each of the plurality of photosensors is a PN photodiode, the first polarity region is a P+ doping semiconductor region, and the second polarity region is an N+ doping semiconductor region.

11. The display panel of claim 3, wherein each of the plurality of photosensors is a PIN photodiode, the first polarity region is a P+ doping semiconductor region, and the second polarity region is an N+ doping semiconductor region, the PIN photodiode further comprises an intrinsic region of amorphous silicon between the P+ doping semiconductor region and the N+ doping semiconductor region.

12. The display panel of claim 1, wherein the counter substrate further comprises a plurality of color filter blocks;
the plurality of photosensors are respectively between the plurality of color filter blocks and the base substrate; and an orthographic projection of each individual one of the plurality of photosensors on the base substrate at least partially overlaps with an orthographic projection of a respective one of the plurality of color filter blocks on the base substrate.

13. The display panel of claim 12, further comprising a common electrode configured to be provided with a common voltage signal;
   wherein an orthographic projection of the common electrode on the base substrate partially overlaps with an orthographic projection of one of the plurality of photosensors on the base substrate; and
   a portion of the common electrode is between one of the plurality of color filter blocks and one of the plurality of photosensors in a same one of the plurality of subpixel areas.

14. The display panel of claim 1, wherein the counter substrate further comprises:
   an overcoat layer on a side of the plurality of second thin film transistors and the plurality of photosensors distal to the base substrate; and
   a spacer layer on a side of the overcoat layer distal to the base substrate.

15. The display panel of claim 14, further comprising an auxiliary cathode on a side of the space layer distal to the base substrate.

16. The display panel of claim 1, wherein the display panel is an organic light emitting diode display panel comprising a plurality of organic light emitting diodes; and
   the plurality of actual light emitting brightness value detectors are configured to detect actual light emitting brightness values of the plurality of organic light emitting diodes respectively.

17. A display apparatus, comprising the display panel of claim 1, and a compensation circuit configured to receive in real time the actual light emitting brightness values of the plurality of subpixel areas, and configured to adjust in real time the actual light emitting brightness values of the plurality of subpixel areas to the target brightness values.

18. A method of fabricating a display panel having a plurality of subpixels, comprising:
   forming an array substrate comprising an array of a plurality of first thin film transistors respectively in the plurality of subpixels for driving light emission of the display panel;
   forming a counter substrate facing the array substrate and having a plurality of subpixel areas respectively in the plurality of subpixels; and
   forming an optical compensation device for adjusting in real time actual light emitting brightness values of the plurality of subpixel areas to target brightness values;
   wherein forming the optical compensation device comprises forming a plurality of actual light emitting brightness value detectors integrated in the counter substrate and respectively in the plurality of subpixel areas;
   wherein forming the counter substrate comprises:
   forming a plurality of second thin film transistors on a base substrate and respectively in the plurality of subpixel areas; and
   forming a plurality of photosensors respectively connected to the plurality of second thin film transistors and respectively in the plurality of subpixel areas, the plurality of photosensors configured to detect actual light emitting brightness values of the plurality of subpixel areas respectively;
   wherein each of the plurality of actual light emitting brightness value detectors comprises one of the plurality of second thin film transistors and to one of the plurality of photosensors electrically connected to each other.

* * * * *